United States Patent
Nakao et al.

[11] Patent Number: 5,880,069
[45] Date of Patent: *Mar. 9, 1999

[54] PROCESS OF MAKING HIGH $T_C$ JOSEPHSON JUNCTION DEVICE

[75] Inventors: Masao Nakao; Hiroaki Furukawa; Ryohkan Yuasa; Shuji Fujiwara, all of Ibaraki-ken, Japan

[73] Assignee: Sanyo Electric Co., Ltd., Osaka, Japan

[ * ] Notice: The term of this patent shall not extend beyond the expiration date of Pat. No. 5,873,985.

[21] Appl. No.: 190,211

[22] Filed: Feb. 1, 1994

Related U.S. Application Data

[63] Continuation of Ser. No. 861,193, Mar. 31, 1992, abandoned.

[30] Foreign Application Priority Data

Apr. 11, 1991 [JP] Japan ................................ 3-079097
Nov. 28, 1991 [JP] Japan ................................ 3-314958

[51] Int. Cl.⁶ .................................................. H01L 39/24
[52] U.S. Cl. ....................... 505/329; 505/190; 505/702; 427/62; 427/63; 216/101
[58] Field of Search ................... 505/329, 190, 505/729, 701, 702, 728; 427/62, 63, 419.3, 419.2; 257/31, 34, 35; 156/637.1; 216/101

[56] References Cited

U.S. PATENT DOCUMENTS 5,157,466 10/1992 Char et al. ................................ 505/1

OTHER PUBLICATIONS

Vasquez et al, "Nonaqueous chemical depth profiling of $YBa_2Cu_3O_{7-x}$" Appl. Phys. lett. 54(11) Mar. 1989 pp. 1060–1062.

Mizuno et al, "Fabrication of thin–film–type Josephson junctions using a Bi–Sr–Ca–Cu–O/Bi–Sr–Cu–O/Bi–Sr–Ca–Cu–O structure" Appl. Phys. lett. 56 (15) Apr., 1990 pp. 1469–1471.

Chew et al, "Orientation control of $YBa_2Cu_3O_7$ thin films on MgO for epitaxial junctions", Appl. Phys. lett. 60(12) Mar. 1992 pp. 1516–1518.

Tsukamoto et al, "Low temperature annealing effect on Bi–Sr–Ca–Cu–O thin films prepared by layer–by–layer deposition", Jpn. J. Appl. Phys. 30(5A) May 1991 pp. L830–L833.

Tsukada et al, "In–situ growth of Bi–Sr–Ca–Cu–O films by shutter –controlled molecular beam epitaxy", Supercond. Sci. Technol. 4(1991) pp. 118–120.

Eckstein et al, "Atomically layered heteroepitaxially growth of single–crystal films of superconducting $Bi_2Sr_2Ca_2Cu_3O_x$", Appl. Phys. lett. 57(9) Aug. 1990, pp. 931–933.

Char, K., et al.,Appl. Phys. Lett. 59, Aug. 1991,"Bi–epitaxial grain boundary junction in YBawCu307",May 13, 1991, pp. 733–735.

Tetsuya Takami, et al., Jpn.J.Appl.Phys. vol.31 (1992) pp. L246–L248, "Artificial Grain Boundary Junction is BiSr-CaCuO Thin Films with (11n) and (001) Orientation".

*Primary Examiner*—Roy V. King
*Attorney, Agent, or Firm*—Loeb & Loeb LLP

[57] ABSTRACT

A desired pattern is formed on a non-superconducting oxide film after the non-superconducting oxide film has been formed on a magnesia substrate. A superconducting oxide film is formed over the exposed parts of the substrate and the non-superconducting oxide film. The epitaxial orientation of the superconducting oxide film section on the non-superconducting oxide film is different from that of the superconducting oxide film section on the substrate. A tilt-boundary junction is produced at a boundary between the superconducting film sections which are different in epitaxial orientation from each other. Thus, a Josephson junction having a desired pattern can be obtained.

8 Claims, 9 Drawing Sheets

PROCESS OF MAKING HIGH $T_C$ JOSEPHSON JUNCTION DEVICE

This is a continuation of application Ser. No. 07/861,193 filed on Mar. 31. 1992, now abandoned.

BACKGROUND OF THE INVENTION

1. Field of the Invention

The present invention relates to a process of making a Josephson junction device having a superconducting oxide film with a high superconducting transition temperature, and an improved Josephson junction device.

2. Description of the Invention

Josephson junction devices having superconducting elements are now regarded as high-speed elements superior to semiconductors since they can operate at increased speeds and also with reduced consumption of electric power. The trial manufacture of a Josephson computer is being energetically undertaken by many manufacturers (see "Technique of Josephson Computer", Parity, Separate Volume No. 1, 1986, pp 40–47).

Josephson junction devices presently developed are mainly of a tunnel Junction type in which a very thin film is sandwiched between members of niobium or niobium nitride. These conventional Josephson junction devices are made on the assumption that they operate at liquid helium temperature. If Josephson junction devices are formed of a superconducting oxide, they can operate at higher temperature (e.g. liquid nitrogen temperature), resulting in an increase of practicality and economical efficiency.

On the other hand, it is known in the art that the naturally produced tilt-boundary junction functions as a Josephson junction. It has been reported that the critical current was measured in a twin tilt-boundary junction of the yttrium compound ($YBa_2Cu_3O_{7-\delta}$). See "PHYSICAL REVIEW LETTERS" issued on Jul. 11, 1988, Vol. 61, No. 2, pp 219–222.

However, a method of controlling the production of a Josephson junction of the tilt-boundary junction is still not known. In the prior art, therefore, it was difficult to produce a number of such Josephson junctions having any patterns at desired locations.

SUMMARY OF THE INVENTION

It is therefore an object of the present invention to overcome the above problems. The present invention is based on the new knowledge that if the order in which an oxide compound thin film and a superconducting oxide thin film are laminated on a magnesia substrate is reversed, the epitaxial orientation of the films is deviated by an angle (e.g. 45 degrees).

In accordance with the present invention, a process of making a Josephson junction device comprises the steps of first forming an oxide thin film on a magnesia substrate in a desired pattern; and forming a superconducting oxide thin film over the oxide thin film and the exposed parts of the magnesia substrate corresponding to the desired pattern of the oxide thin film to produce tilt-boundaries between the superconducting oxide thin film on the magnesia substrate and the superconducting oxide thin film on the oxide thin film.

A Josephson junction device constructed in accordance with the present invention comprises a substrate of magnesia (MgO), an oxide thin film formed on part of the substrate, a superconducting oxide thin film formed on the oxide thin film and substrate, and tilt-boundaries between the superconducting oxide thin film on the magnesia substrate and the superconducting oxide thin film on the oxide thin film.

At the step of forming the oxide thin film into the desired pattern, the magnesia substrate has the non-exposed faces covered by the oxide thin film and the exposed faces at which the oxide thin film is removed. After the superconducting oxide thin film has been formed over both the non-exposed and exposed faces, it will have a deviation in epitaxial orientation by an angle between the parts of magnesia substrate and oxide thin film. Thus, any tilt-boundary junction can be artificially formed at the boundary of the pattern. By controlling the configuration of the oxide thin film, therefore, one can provide a Josephson junction having any desired pattern.

In accordance with the present invention, a number of Josephson junctions having any desired pattern can be produced on the substrate at desired locations. Thus, the present invention can very easily produce Josephson junction devices having a superconducting thin film with a high superconducting transition temperature. The Josephson junction device constructed in accordance with the present invention will be highly improved in practicality and economical efficiency.

DETAILED DESCRIPTION OF PREFERRED EMBODIMENT

The present invention will now be described by way of example with reference to the drawings.

Figure 1:
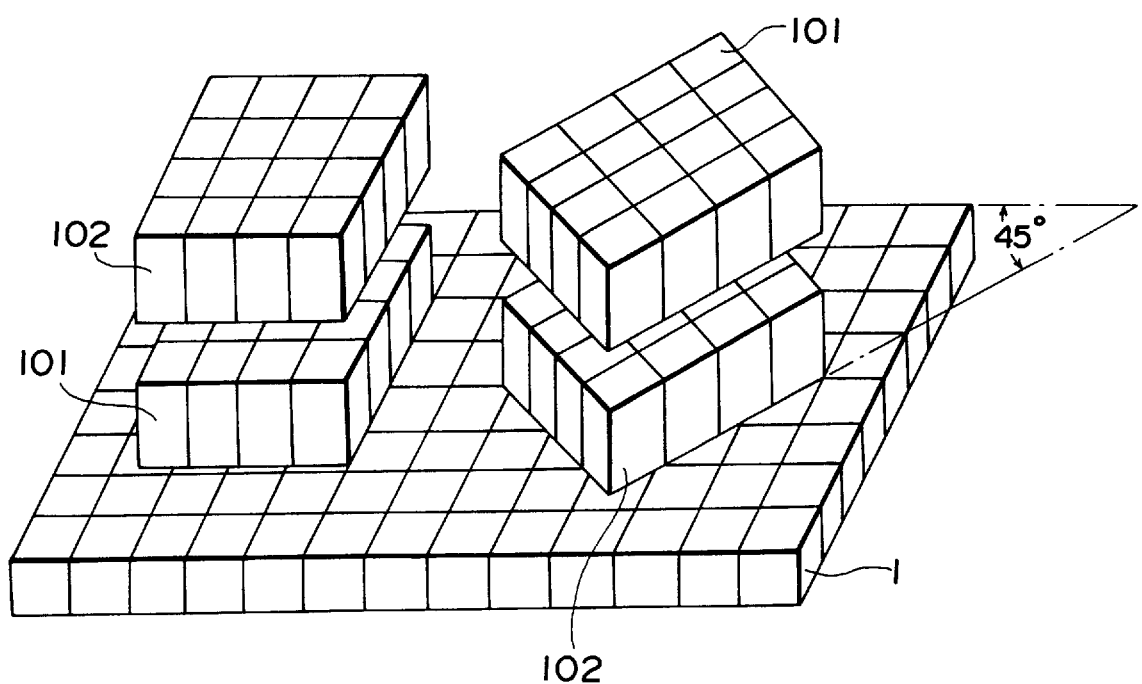
FIG. 1 is a diagrammatic view of thin Bi-Sr-Ca-Cu-O superconducting films laminated on a substrate of MgO.

FIG. 1 is a diagrammatic view illustrating that when a non-superconducting oxide ($Bi_2Sr_2Cu_1O_6$) thin film 101 is laminated with a superconducting oxide ($Bi_2Sr_2Ca_1Cu_2O_8$) thin film 102 on a substrate of magnesia (MgO) 1 in the reverse order, the epitaxial orientation is deviated by 45 degrees.

More particularly, an epitaxial orientation obtained when the non-superconducting oxide ($Bi_2Sr_2Cu_1O_6$) thin film 101 is first formed on the magnesia substrate 1 and the superconducting oxide ($Bi_2Sr_2Ca_1Cu_2O_8$) thin film 102 is then formed on the non-superconducting oxide thin film 101 is deviated 45 degrees from another epitaxial orientation obtained when the superconducting oxide ($Bi_2Sr_2Ca_1Cu_2O_8$) thin film 102 is first formed on the magnesia substrate 1 and the non-superconducting oxide ($Bi_2Sr_2Cu_1O_6$) thin film 101 is then formed on the superconducting oxide thin film 102 in the reverse order, as viewed in the horizontal plane of the magnesia substrate 1. It is believed that such a deviation results from any mismatching in the crystal lattice due to a deviation in crystal size between MgO and Bi-Sr-Cu-O.

Figure 2:
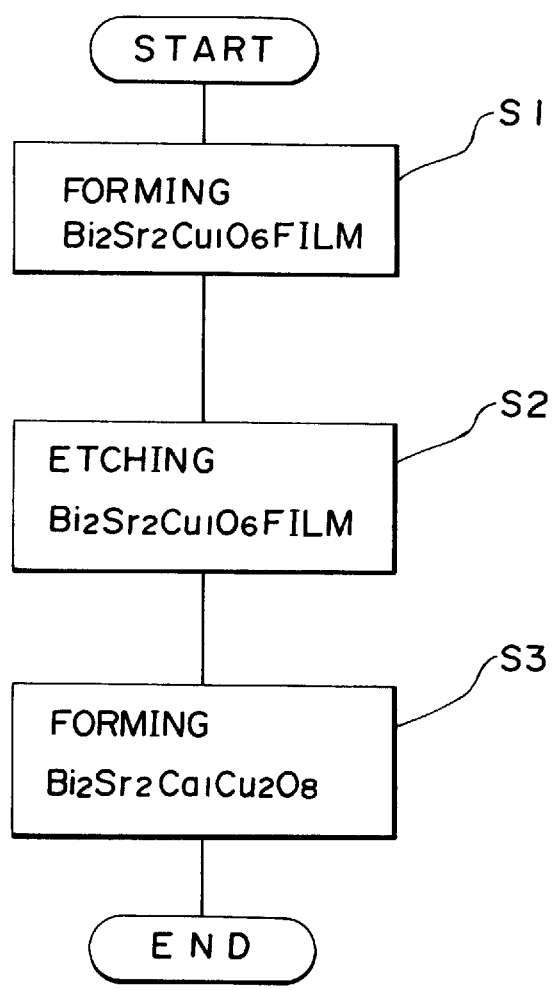
FIG. 2 is a flowchart illustrating the entire operation of an embodiment of the present invention.

In accordance with the present invention, thus, a tilt-boundary junction is formed by the use of such a treatment as shown in FIG. 2. First, the non-superconducting oxide ($Bi_2Sr_2Cu_1O_6$) thin film 101 is formed on the magnesia substrate 1 (S1). Predetermined parts of the formed film 101 are then removed by etching to expose parts of the magnesia substrate 1 (S2). Finally, the superconducting oxide ($Bi_2Sr_2Ca_1Cu_2O_8$) thin film 102 is formed over the entire surface of the magnesia substrate 1 and non-superconducting oxide film 101 (S3). Each part of the thin film 102 on the magnesia substrate 1 will have an epitaxial orientation deviated 45 degrees along a and b axes on the crystal surface from that of the corresponding part of the thin film 102 on the thin film 101 to form a tilt-boundary junction. If parts of the thin film 101 to be removed are controlled, thus, it is possible to form the tilt-boundary junction having any desired pattern.

Figure 3:
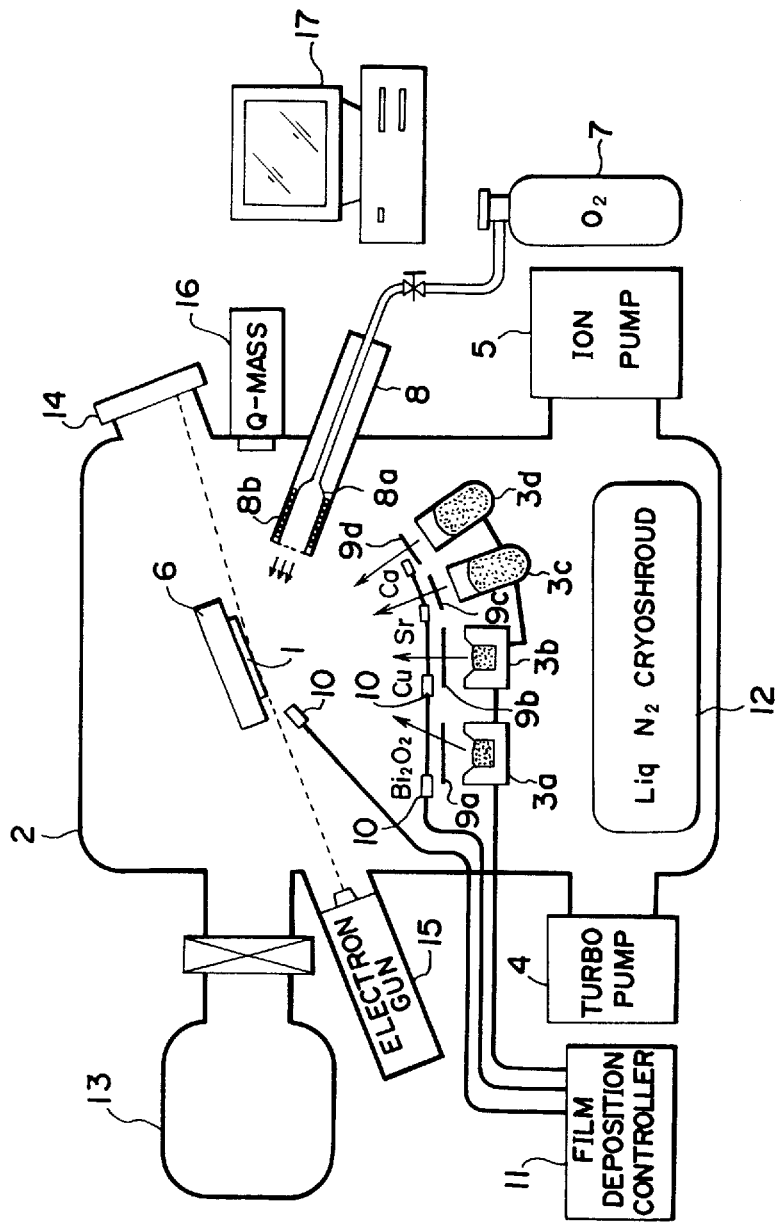
FIG. 3 is a schematic diagram of a film forming apparatus which uses a molecular beam epitaxy system.

Referring to FIG. 3, there is shown a film forming apparatus using a molecular beam epitaxy system. The film forming apparatus comprises an air-tight growth chamber 2 and four sources of evaporation 3a–3d which are disposed within the growth chamber 2. Each of these sources 3a–3d independently emits bismuth oxide ($Bi_2O_3$), metal strontium (Sr), metal calcium (Ca) or copper (Cu) respectively in the form of molecules or atoms. The matter emitted from each source irradiates onto the magnesia substrate 1. Two of these sources of evaporation 3a and 3b are electron beam sources while the remaining sources 3c and 3d are resistance heating crucibles. The growth chamber 2 is connected to a turbo pump 4 and an ion pump 5. These pumps 4 and 5 are adapted to evacuate the growth chamber 2 to maintain the interior thereof at a given state.

A substrate holder 6 is disposed in the growth chamber 2 at the upper level and is adapted to hold the magnesia substrate 1 at a fixed position. The chamber 2 further includes a source of an oxygen radical beam 8 which is adapted to receive gaseous oxygen from a supply of oxygen 7 and to convert the gaseous oxygen into oxygen radicals (also called excited, nascent state and atomic state oxygen) which are in turn blown onto the magnesia substrate 1. The source of the oxygen radical beam 8 includes a quartz tube 8a through which the gaseous oxygen passes and a coil 8b wound about the quartz tube 8a. When the coil 8b is energized by a high-frequency electric current, the gaseous oxygen in the quartz tube 8a will be high-frequency excited to separate the oxygen into oxygen radicals. The front face of the quartz tube 8a includes a plurality, of openings formed therein through which the oxygen radicals are drawn out of the quartz tube 8a under a differential pressure between the interior of the quartz tube 8a and the growth chamber 2. In such a manner, the oxygen atoms will be efficiently blown onto the magnesia substrate 1.

Above each of the sources 3a–3d is disposed a shutter 9a, 9b, 9c or 9d which is adapted to control the irradiation of the emitted matter from the corresponding source 3a, 3b, 3c or 3d onto the substrate 1. Sensors 10a–10e are located near the shutters 9a–9d and substrate 1, respectively. The outputs of these sensors 10a–10e are supplied to a film deposition controller 11 which is adapted to control the evaporation from at least the sources 3a and 3b, depending on the results of detection at the sensors 10a–10e. The substrate 1 is heated by a heater (not shown) which is located within the holder 6. The growth chamber 2 further includes a liquid nitrogen shroud 12 to prevent the generation of gases from peripheral areas of the sources 3a–3d.

The growth chamber 2 is connected to a loading chamber 13 which is used to load and unload the substrate 1 on condition that the growth chamber 2 is isolated from the atomospher. A RHEED screen 14 is provided for analyzing the crystal structures of thin films formed on the substrate 1, based on a diffraction state of an electron beam from an electron gun 15 which reaches the RHEED screen 14. The growth chamber 2 is further connected to a quardrupole mass analyzer 16 for analyzing the composition of the gas within the growth chamber 2. A computer 17 is provided for controlling the entire operation of the film forming apparatus.

When it is desired to form the Bi-Sr-Cu-O thin film 101 on the magnesia substrate 1, the materials $Bi_2O_3$, Sr, Cu and oxygen radicals O* are irradiated onto the substrate 1 after being heated to a given temperature. The materials $Bi_2O_3$, Sr and Cu are sequentially evaporated from the respective sources by sequentially opening the shutters 9a–9d. The order of Bi-Sr-Cu-Sr-Bi forms one cycle of deposition which will be repeated sequentially. Thus, the thin film 101 will be formed sequentially in such an order as shown by Bi-Sr-Cu-Sr, Bi-Sr-Cu-Sr, . . . and Bi-Sr-Cu-Sr. At the same time, oxygen radicals are supplied to the magnesia substrate 2 during each deposition cycle. The rate of evaporation from each of the sources is: 0.125 nm/sec. for $Bi_2O_3$; 0.22 nm/sec. for Sr; and 0.04 nm/sec. for Cu. The rate of supply for O* is equal to $1 \times 10^{16}$ species/sec-$cm^2$. The rate of evaporation is determined by measuring the amount of deposition on each of the respective sensors 10.

The time for which each source 3 of evaporation is released once by opening the corresponding shutter a during one cycle is as follows: 3.20 seconds for $Bi_2O_3$; 4.02 seconds for Sr; and 2.90 seconds for Cu. The cycle was repeated 2–100 times to obtain a thin film 101 having a given thickness.

When it was set that the temperature of the substrate is in the range between 650° C. and 750° C. and that the speed of film growth is in the range between 0.02 nm/sec. and 0.1 nm/sec., a thin Bi-Sr-Cu-O film was obtained with its thickness in the range between 2.4 nm and 130 nm. It is further desirable that the non-superconducting oxide ($Bi_2Sr_2Cu_1O_6$) thin film is formed so as to be as thin as possible to prevent any steps from being created on the surface of the final product.

Although this embodiment has been described as to the simultaneous irradiation of the materials $Bi_2O_3$, Sr and Cu and oxygen radicals O*, the oxygen radicals O* may be irradiated onto the substrate after each layer of Bi-Sr-Cu-Sr-Bi has been deposited on the substrate.

The non-superconducting oxide thin film 101 is then etched to form a desired pattern thereon. In such a step, the magnesia substrate 1 will have exposed parts created by partially removing the non-superconducting oxide thin film 101.

Figure 4:
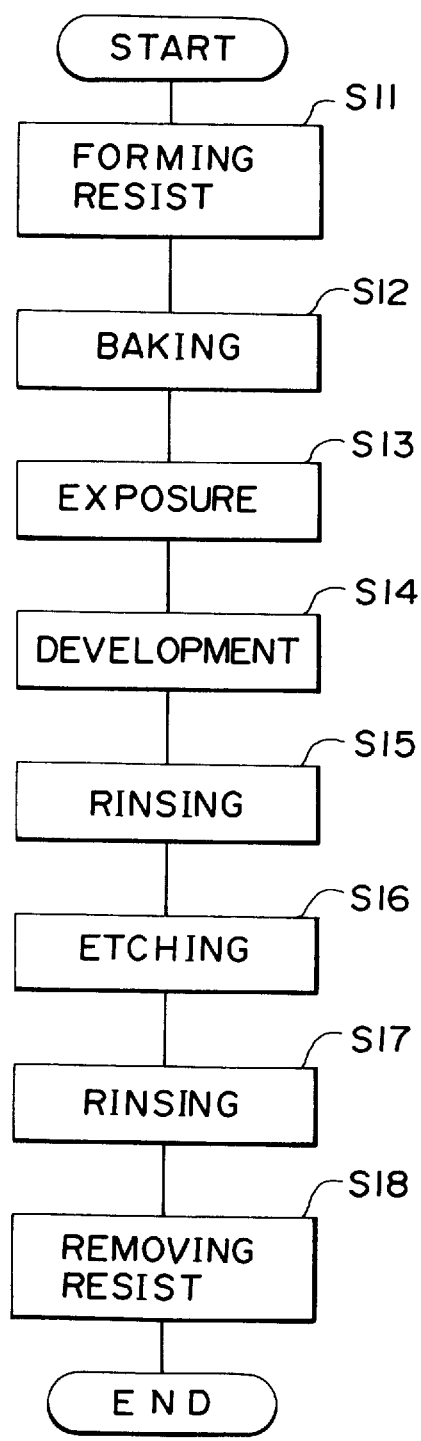
FIG. 4 is a flowchart illustrating the etching steps.

The etching step for the non-superconducting oxide ($Bi_2Sr_2Cu_1O_6$) thin film 101 will be described with reference to FIG. 4. First of all, a PMMA electron beam resist layer (trade name: 0EBR-1000 manufactured by TOKYO OHKA KOGYO) having a film thickness equal to about 0.6

μm is applied over the non-superconducting oxide thin film 101 (S11). This application of resist may be carried out in any suitable manner such as spin coating or the like. It is then baked at 150° C., for about 20 minutes (S12). The formed resist layer is then subjected to an exposure step by the use of a focused ion beam (FIB) system (S13). The exposure is done under the following conditions: 200 keV, Be++ and $1 \times 10^{13}$ ions/cm$^2$. The exposed resist is developed to partially remove it along the desired pattern by the use of a mixture of methylcellosolve with isopropyl alcohol (S14). The development step is done with the mixture of methylcellosolve:isopropyl alcohol=72.5:27.5 at 22° C. for about 4 minutes. However, the conditions of development need not be limited severely to such parameters, but may be changed through a very widened range. After the development, the film is rinsed by isopropylalcohol at room temperature for several tens of seconds (S15).

A solution of bromine ($Br_2$) with ethanol (0.01–1% by volume) is used to etch the non-superconducting oxide thin film 101 at those parts from which the resist is removed (S16). The etching step is carried out at room temperature for about 10–20 seconds. After the etching step, the film is rinsed by ethanol (S17).

Finally, the film is rinsed by acetone for several minutes to remove the remaining resist(S18). After being dried, the magnesia substrate 1 will have the non-superconducting oxide thin film 101 and the exposed parts of the magnesia substrate 1. Since any pattern can be provided by exposure, it is possible to obtain a Josephson junction having any desired pattern.

Although the above embodiment has been described as to the use of PMMA as resist, the present invention is not limited to such a resist and may be applied to any other suitable resist material. Since it must be non-soluble on etching, however, it is necessary to use a resist which is non-soluble with ethanol. Further, the exposure may be performed by electron beam or X-ray beam rather than FIB.

The aforementioned etching is carried out without exposure to water. If water is used on etching, the non-superconducting oxide thin film 101 and magnesia substrate 1 will be greatly damaged, breaking the crystal structure of the surfaces. In this case, a superconducting oxide thin film 102 to be laminated onto the non-superconducting oxide thin film 101 and magnesia substrate 1 will not be formed with a satisfactory crystal structure.

The etching step may be replaced by another step at which the magnesia substrate 1 is covered with a metallic mask (not shown) having a desired pattern and the non-superconducting oxide thin film 101 is then formed on predetermined parts of the magnesia substrate 1 in such a manner as described hereinbefore.

The materials $Bi_2O_3$, Sr, Ca and Cu and oxygen radicals O* are then irradiated onto the heated substrate 1 to form a Bi-Sr-Ca-Cu-O superconducting oxide thin film 102 in the same manner as described hereinbefore. The materials $Bi_{23}$, Sr, Ca and Cu are deposited on the substrate 1 in the order of Bi-Sr-Cu-Ca-Cu-Sr-Bi during one cycle. Such a cycle is repeated to deposit these materials on the substrate 1. The rates of evaporation and supply for each substance is substantially as follows: 0.125 nm/sec. for $Bi_2O_3$; 0.22 nm/sec. for Sr; 0.04 nm/sec. for Cu; 0.22 nm/sec. for Ca; and $1 \times 10^{16}$ species/sec-cm$^2$ for the oxygen radicals.

Each source of evaporation is released by opening the corresponding shutter for the following time period: 3.20 seconds for $Bi_2O_3$; 4.02 seconds for Sr; 2.90 seconds for Cu; and 3.85 seconds for Ca. This cycle is repeated 10–1000 times.

When it is set that the temperature of the heated substrate 1 is in the range between 650° C. and 750° C. and that the speed of film growth is in the range between 0.02 nm/sec. and 0.1 nm/sec., a Bi-Sr-Ca-Cu-O superconducting oxide thin film 102 having a thickness in the range between 15 nm and 150 nm was obtained.

Although this embodiment has been described as to the simultaneous irradiation of the materials $Bi_2O_3$, Sr, Ca, Cu and O*, only the oxygen radicals O* may be irradiated onto the substrate 1 after each layer of Bi-Sr-Cu-Ca-Cu-Sr-Bi has been deposited on the substrate 1.

Figure 5:
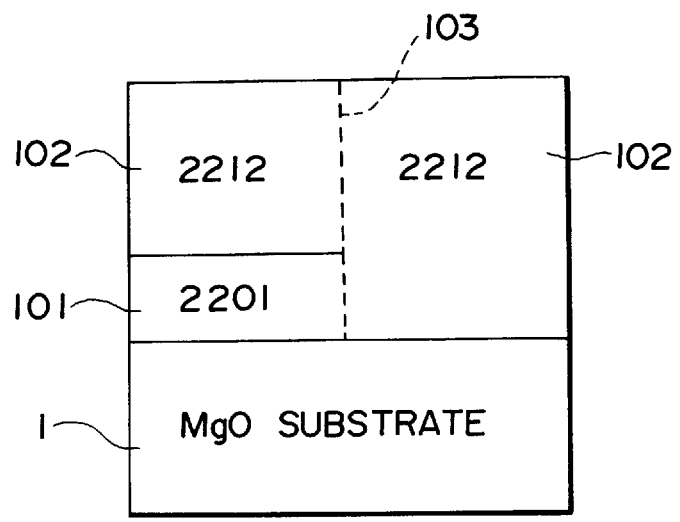
FIG. 5 is a diagrammatic cross-section of a laminate comprising a thin Bi-Sr-Cu-O film and a thin Bi-Sr-Ca-Cu-O superconducting film on the MgO substrate.

FIG. 5 is a diagrammatic view illustrating that after the non-superconducting oxide ($Bi_2Sr_2Cu_1O_6$) thin film 101 shown by 2201 has been formed on the magnesia substrate 1, the surface of the,magnesia substrate 1 is partially exposed by forming the desired pattern thereon and that a superconducting oxide ($Bi_2Sr_2Ca_1Cu_2O_8$) thin film 102 as shown by 2212 in FIG. 3 is formed over the exposed parts of the magnesia substrate 1 and the non-superconducting oxide thin film 101. In FIG. 5, the superconducting oxide thin film 102 is shown to have a flat surface. Actually, no steps will be created on the surface of the superconducting oxide thin film 102 since it is uniformly deposited over the exposed parts of the magnesia substrate 1 and the non-superconducting oxide thin film 101.

Figure 6:
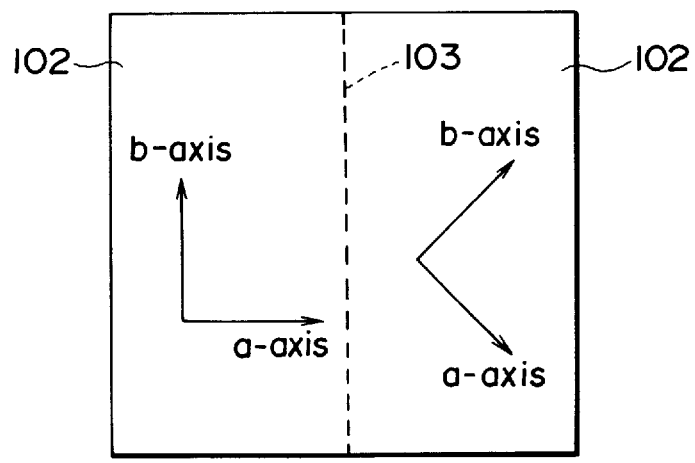
FIG. 6 is a diagrammatical plan view illustrating a deviation in epitaxial orientation in the thin Bi-Sr-Ca-Cu-O superconducting film.

FIG. 6 is a plan view showing such a structure. As will be apparent from this figure, the epitaxial orientation (a- and b-axes) of the superconducting oxide thin film 102 on the magnesia substrate 1 is deviated 45 degrees from that of the superconducting oxide thin film 102 on the non-superconducting oxide thin film 101. FIG. 6 also shows a tilt-boundary junction 103 formed between the superconducting oxide thin film 102 and the non-superconducting oxide thin film 101.

Figure 7:
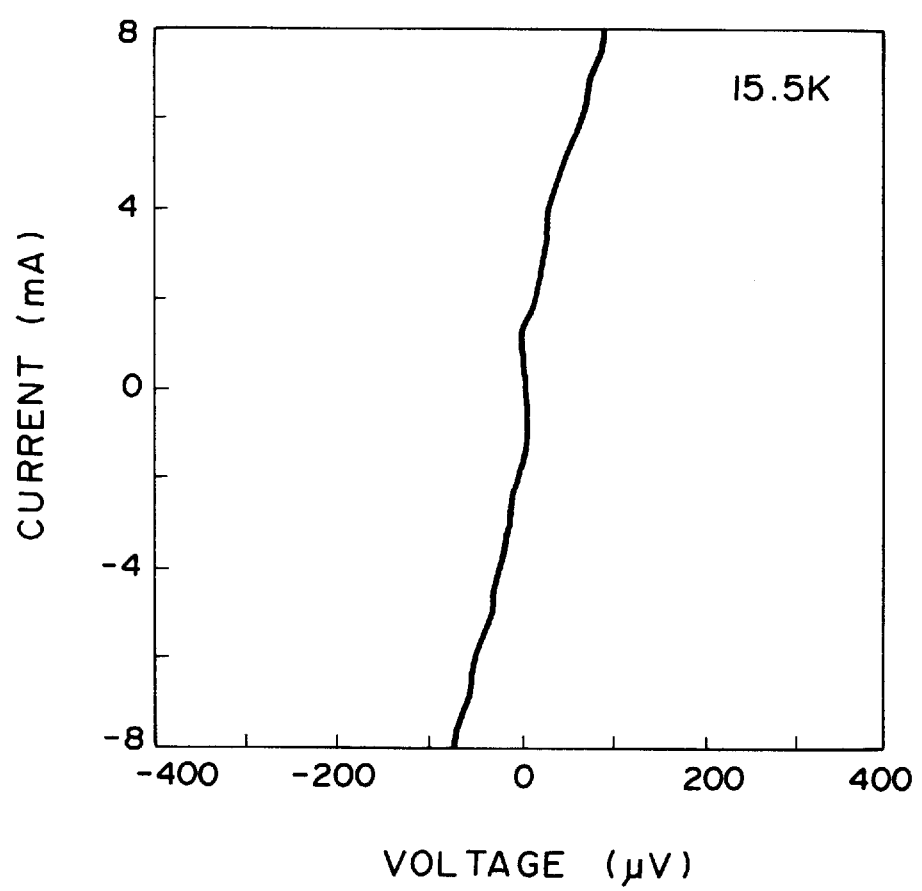
FIG. 7 is a graph illustrating current-voltage characteristics in the tilt-boundary junction at 15.5K.
Figure 8:
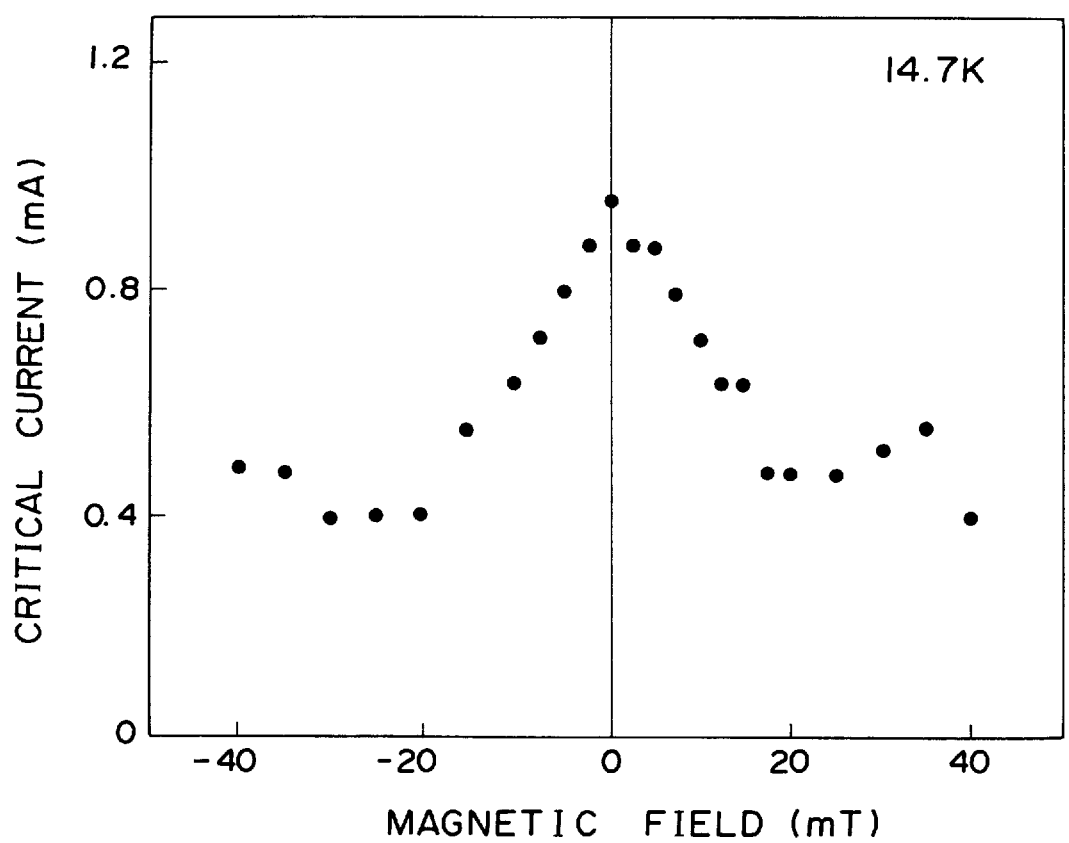
FIG. 8 is a graph illustrating the dependency of current on the magnetic field in the tilt-boundary junction at 14.7K.

FIGS. 7 and 8 illustrate that the tilt-boundary junction (having a junction size of 1 mm×0.1 μm) functions as a Josephson junction. FIG. 7 shows the current-voltage characteristics in the tilt-boundary junction at 15.5K. It will be apparent from FIG. 7 that the current changes to 1.2 mA at zero voltage. This shows that the superconducting current is 1.2 mA. FIG. 8 shows the dependency of critical current on magnetic field at 14.7K in the tilt-boundary junction. It will be apparent from FIG. 8 that the critical current periodically changes depending on changes of the magnetic field. Such a phenomenon is called Fraunhofer's pattern. This indicates that the produced junction is a Josephson junction. If the Frauhofer's pattern is in an ideal form, the critical current at a trough in the pattern must be equal to zero. It is, however, well-known that if the Josephson junction has an area of some magnitude, the critical current at the trough will not be equal to zero. It is therefore understood from FIG. 8 that the formed junction functions as a Josephson junction.

Figure 9:
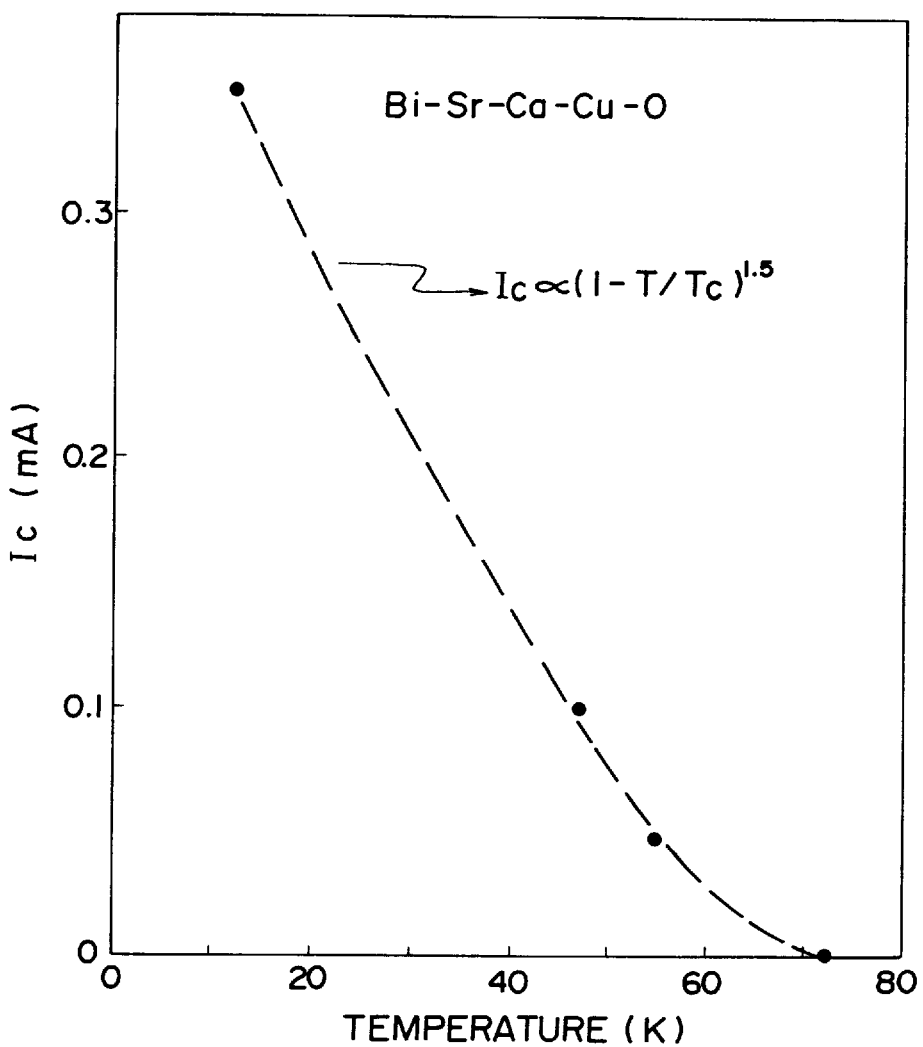
FIG. 9 is a graph illustrating changes of the critical current relative to temperatures.

FIG. 9 also illustrates that this tilt-boundary junction functions as a Josephson junction and that the critical current in the tilt-boundary junction changes depending on temperature. Apparently, there is produced a superconducting current at a level equal to or less than 70K. In FIG. 9, the critical current is denoted by Ic; the measured temperature T; and the critical temperature Tc.

Although this embodiment has been described as to the superconducting oxide thin film of $Bi_2Sr_2Ca_1Cu_2O_8$, it may be replaced by any other appropriate superconducting oxide film or any one of the other superconducting oxides and/or the other substrate materials.

Figure 10:
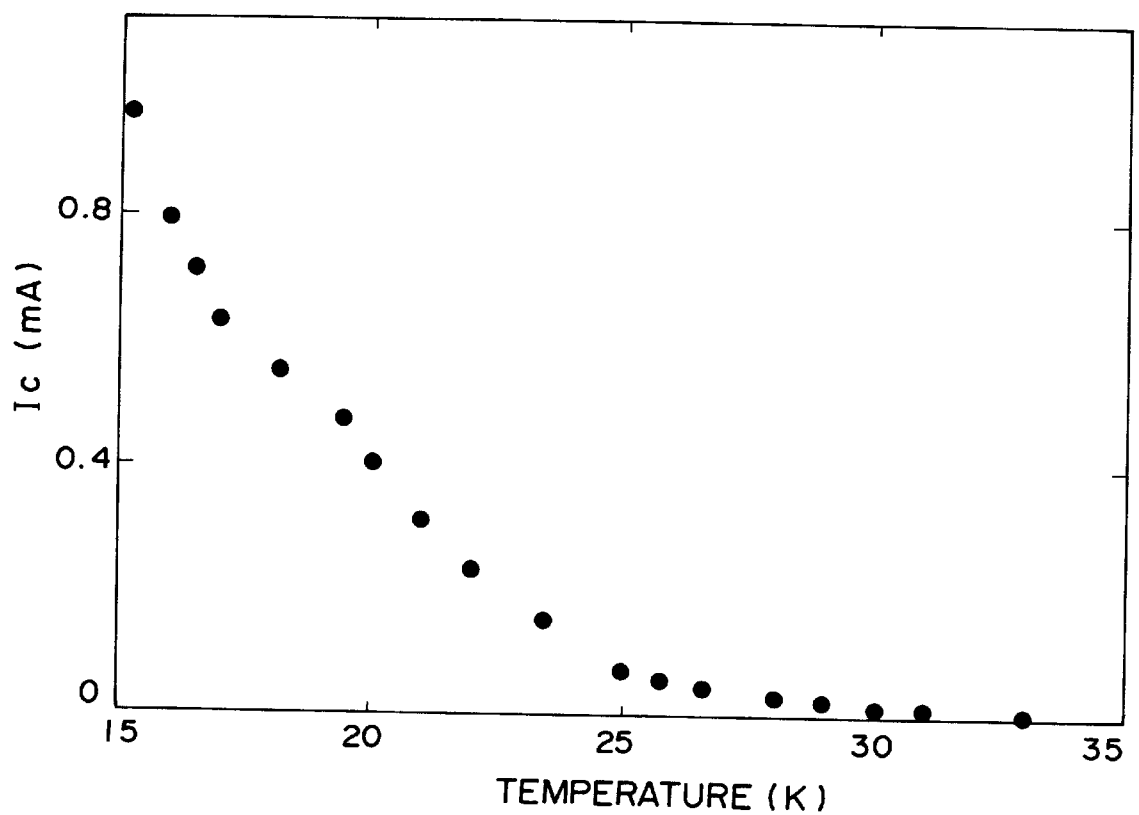
FIG. 10 is a graph illustrating changes of the critical current relative to temperatures.

Furthermore, FIG. 10 shows that the other Josephson junction utilizing a tilt-boundary junction prepared substantially under the same conditions as described hereinbefore has its critical current changing depending on temperature. In this example, the superconducting current flows therein at a level equal to or less than 35K. Similarly, the superconducting current near 15.5K is equal to about 1.2 mA.

In order to cause the Josephson junctions thus prepared to actually operate, they include electrodes mounted on two parts of the the superconducting oxide thin film 102 which are connected to each other through the tilt-boundary junction.

We claim:

1. A method of forming a Josephson junction device comprising the steps of: forming a non-superconducting oxide film of Bi—Sr—Cu—O compound by sequentially depositing at least Bi, Sr and Cu on a magnesia substrate in a pattern; and forming a superconducting oxide film of Bi—Sr—Ca—Cu—O compound by sequentially depositing at least Bi, Sr, Ca and Cu over the exposed part of said magnesia substrate and said non-superconducting oxide film to form a tilt-boundary junction between said superconducting oxide film on said magnesia substrate and said superconducting oxide film on said non-superconducting oxide film.

2. A method as defined in claim 1 wherein said non-superconducting oxide film of Bi—Sr—Cu—O is of $Bi_2Sr_2Cu_1O_6$.

3. A process as defined in claim 1 wherein said superconducting oxide film of Bi—Sr—Ca—Cu—O compound is $Bi_2Sr_2Ca_1Cu_2O_8$.

4. A method as defined in claim 1 wherein said step of forming the pattern comprises a step of partially etching the non-superconducting oxide film along the pattern after said non-superconducting oxide film has been formed on said magnesia substrate.

5. A method as defined in claim 4 wherein said etching step uses a solution of bromine with ethanol to etch said non-superconducting oxide film.

6. A method as defined in claim 5 wherein said etching step is performed without the use of water.

7. A method as defined in claim 1 wherein said step of forming a non-superconducting oxide film is carried out by depositing $Bi_2O_3$, Sr, Cu, Sr and $Bi_2O_3$, in the order recited, on the substrate.

8. A method as defined in claim 1 wherein said step of forming a superconducting oxide film is carried out by depositing $Bi_2O_3$, Sr, Cu, Ca, Cu, Sr and $Bi_2O_3$, in the order recited, on the substrate.

* * * * *